(12) United States Patent
Thapa et al.

(10) Patent No.: US 10,283,356 B2
(45) Date of Patent: May 7, 2019

(54) SEMICONDUCTOR WAFER COMPRISING A MONOCRYSTALLINE GROUP-IIIA NITRIDE LAYER

(71) Applicant: Siltronic AG, Munich (DE)

(72) Inventors: Sarad Bahadur Thapa, Burghausen (DE); Maik Haeberlen, Burghausen (DE); Marvin Zoellner, Frankfurt A.D. Oder (DE); Thomas Schroeder, Berlin (DE)

(73) Assignee: SILTRONIC AG, Munich (DE)

( * ) Notice: Subject to any disclaimer, the term of this patent is extended or adjusted under 35 U.S.C. 154(b) by 4 days.

(21) Appl. No.: 15/547,529

(22) PCT Filed: Jan. 15, 2016

(86) PCT No.: PCT/EP2016/050760
§ 371 (c)(1),
(2) Date: Jul. 31, 2017

(87) PCT Pub. No.: WO2016/120098
PCT Pub. Date: Aug. 4, 2016

(65) Prior Publication Data
US 2017/0372888 A1  Dec. 28, 2017

(30) Foreign Application Priority Data

Jan. 30, 2015 (EP) .................................. 15153303

(51) Int. Cl.
*H01L 21/02* (2006.01)
*H01L 29/04* (2006.01)
(Continued)

(52) U.S. Cl.
CPC ...... *H01L 21/0254* (2013.01); *H01L 21/0243* (2013.01); *H01L 21/0265* (2013.01); *H01L 21/02381* (2013.01); *H01L 21/02433* (2013.01); *H01L 21/02458* (2013.01); *H01L 21/02491* (2013.01); *H01L 21/02502* (2013.01);
(Continued)

(58) Field of Classification Search
None
See application file for complete search history.

(56) References Cited

U.S. PATENT DOCUMENTS

2008/0149941 A1* 6/2008 Li .................... B82Y 10/00
257/76
2010/0035416 A1* 2/2010 Chen ................ H01L 21/02381
438/481

FOREIGN PATENT DOCUMENTS

EP  2779213 A1  9/2014

OTHER PUBLICATIONS

Moram et al., "Growth of Dislocation-free GaN Islands on Si(111) Using a Scandium Nitride Buffer Layer," Journal of Crystal Growth, Elsevier, Oct. 15, 2007, pp. 302-308, vol. 308, No. 2, Amsterdam, NL.

(Continued)

*Primary Examiner* — Calvin Y Choi
(74) *Attorney, Agent, or Firm* — Brooks Kushman P.C.

(57) ABSTRACT

Problems associated with the mismatch between a silicon substrate and a group-IIIA nitride layer are addressed by employing a silicon substrate processed to have a surface comprising closely spaced tips extending from the surface, depositing a group-IIIB silicide layer on the tips, then depositing a group-IIIB nitride layer, and then depositing a group-IIIA nitride.

22 Claims, 3 Drawing Sheets

(51) Int. Cl.
*H01L 29/06* (2006.01)
*H01L 29/267* (2006.01)

(52) U.S. Cl.
CPC .. *H01L 21/02516* (2013.01); *H01L 21/02603* (2013.01); *H01L 21/02609* (2013.01); *H01L 21/02639* (2013.01); *H01L 21/02645* (2013.01); *H01L 29/045* (2013.01); *H01L 29/0657* (2013.01); *H01L 29/267* (2013.01)

(56) References Cited

OTHER PUBLICATIONS

Shiu et al., "Does Scandium Resemble Transition or Rare Earth Metals When it is Grown on Silicon Surfaces?", Journal of Applied Physics, Jan. 28, 2013, p. 43701, vol. 113, No. 4, American Institute of Physics, US.

Strittmatter et al., "Maskless Epitaxial Lateral Overgrowth of GaN Layers on Structured Si(111) Substrates," Applied Physics Letters, Feb. 5, 2001, pp. 727-729, vol. 78, No. 6, American Institute of Physics, US.

Lee et al., "GaN on Si With Nm-thick Single-crystal Sc2O3 as a Template Using Molecular Beam Epitaxy," Journal of Crystal Growth, Elsevier, Nov. 8, 2008, pp. 2006-2009, vol. 311, Amsterdam, NL.

Wang et al., "Micro-Raman-scattering Study of Stress Distribution in GaN Films Grown on Patterned Si(111) by Metal-organic Chemical-vapor Deposition," Journal of Applied Physics, Feb. 10, 2005, vol. 97, American Institute of Physics, US.

Norenberg et al., "Surface Structures of Scandium Silicides Grown on Si(111) Studied by STM, AFM and Electron Diffraction," Surface Science, Elsevier, May 8, 2006, pp. 4126-4131, vol. 600, Amsterdam, NL.

Baptist et al., "Surface Crystallography of YSi2-x Films Epitaxially Grown on Si(111): An X-Ray Photoelectron Diffraction Study," Physical Review Letters, Jan. 15, 1990, pp. 311-314, vol. 64, No. 3, The American Physical Society, US.

Rogero et al., "Structural Determination of Two-dimensional YSi2 Epitaxially Grown on Si(111)," Physical Review B, Dec. 30, 2002, vol. 66, The American Physical Society, US.

Ali et al., "Void Shape Control in GaN Re-grown on Hexagonally Patterned Mask-less GaN," Journal of Crystal Growth, Elsevier, 2011, pp. 188-191, vol. 315, Amsterdam, NL.

Tanaka et al., "Structural Characterization of GaN Laterally Overgrown on a (111)Si Substrate," Applied Physics Letters, Aug. 13, 2001, pp. 955-957, vol. 79, No. 7, American Institute of Physics, US.

\* cited by examiner

SEMICONDUCTOR WAFER COMPRISING A MONOCRYSTALLINE GROUP-IIIA NITRIDE LAYER

CROSS REFERENCE TO RELATED APPLICATIONS

This application is the U.S. National Phase of PCT Appln. No. PCT/EP2016/050760 filed Jan. 15, 2016, which claims priority to European Application No. 15153303.1 filed Jan. 30, 2015, the disclosures of which are incorporated in their entirety by reference herein.

BACKGROUND OF THE INVENTION

1. Field of the Invention

The present invention relates to a semiconductor wafer comprising a monocrystalline substrate wafer consisting essentially of silicon and a monocrystalline main group-IIIA (IUPAC group 13, Boron family elements) nitride layer, especially $In_xAl_zGa_{1-(x+z)}N$ with $0 \leq x, z, (x+z) \leq 1$.

2. Description of the Related Art

Monocrystalline gallium nitride (GaN) is of increasing importance as a substrate for producing light emitting diodes (LEDs) and field effect transistors (FETs) for high power and high frequency applications. The surface area of the substrate is a key issue for the productivity of the manufacturing process and therefore for the cost of a LED or FET. The deposition of high quality GaN epi layers is hindered by the availability of native or closely matching substrates.

As monocrystalline silicon substrates with diameters of up to 300 mm or even up to 450 mm are currently available with high crystal and surface quality, efforts are being made to use monocrystalline silicon as a substrate for the epitaxial growth of GaN. However, due to the large lattice mismatch of 17% between GaN(0001) and Si(111) and the large difference in the thermal expansion coefficients (TEC) of the two materials, high quality GaN layers cannot be grown directly on silicon (Si). The large difference in lattice and thermal mismatch results in a multitude of defects, high mechanical stresses in the film, wafer warpage and even cracking and delamination of the grown group-IIIA nitride films.

For this reason, many types of intermediate or buffer layers have been proposed in order to increase the quality of the epitaxially grown GaN layer.

One of the predominantly used methods to grow GaN on Si is depositing AlN as a seed layer followed by engineered buffer layers to reduce strain. Epitaxial lateral over growth (ELO) or Pendeo epitaxy approaches using additional masking layer, e.g. ex-situ $SiO_2$ or in-situ SiN, are well-known techniques to reduce threading dislocations. However, retaining compressive strain in GaN film during growth is very difficult while using these techniques.

M. Moram et al., J. Crystal Growth 308 (2007), 302-308 teach the use of an epitaxial (111) oriented scandium nitride (ScN) buffer layer as a basis for GaN epitaxy. The ScN layers with a thickness ranging from 50 to 450 nm were grown on n-type Si(111) wafers using gas-source molecular beam epitaxy (GS-MBE) with ammonia as the nitrogen precursor. GaN layers were grown on the ScN/Si(111) templates using a Thomas Swan close-coupled showerhead MOVPE reactor operating at 100 Torr. In preparation for GaN growth, each template used was heated to the growth temperature at a rate of 1 K/s under a flow of 10 slm (standard liter per minute) ammonia ($NH_3$) and 10 slm hydrogen ($H_2$) in order to remove any native oxide from the surface of the ScN layers. The ScN buffer layer was rough and full of defects. The GaN grew on the ScN surface in the form of dislocation-free islands. By varying the GaN growth temperature, the GaN islands could be caused to coalesce in order to yield a smooth GaN film, but at the same time the density of threading dislocations on the surface of the GaN layer increased considerably up to $5 \times 10^9$ $cm^{-2}$.

W. C. Lee et al., J. Crystal Growth 311 (2009), 2006-2009 disclose single-crystalline scandium oxide ($Sc_2O_3$) as a template for GaN epitaxy. $Sc_2O_3$ films were deposited using e-beam evaporation from a high-purity powder-packed-sintered $Sc_2O_3$ oxide source. A few monolayers of aluminum (Al) were deposited on the $Sc_2O_3$ surface using molecular beam epitaxy (MBE), followed by the exposure to nitrogen plasma for nitridation in order to form a thin aluminum nitride (AlN) layer. GaN was deposited on top of this layer. The substrate temperature for growing AlN was at about 645° C. in the beginning and was raised to 720° C., which was also used for the rest of the GaN growth. The method results in a high defect density in the $Sc_2O_3$ buffer and a limited GaN layer quality. Dislocations occurred in a density in the range of $10^{10}$ $cm^{-3}$. The dislocations propagated throughout the layer starting from the $Sc_2O_3$/Si interface.

EP 2 779 213 A1 discloses a semiconductor wafer comprising a monocrystalline substrate wafer consisting essentially of silicon and having a (111) surface orientation, a monocrystalline layer of $Sc_2O_3$ having a (111) surface orientation, a monocrystalline layer of ScN having a (111) surface orientation, and a monocrystalline layer of $Al_zGa_{1-z}N$ with $0 \leq z \leq 1$ having a (0001) surface orientation.

Another method is deposition on patterned Si substrate to reduce both line defects and wafer warpage. D. Wang et al., J. Appl. Phys. 97, 056103 (2005) "Micro-Raman-scattering study of stress distribution in GaN films grown on patterned Si(111) by metal-organic chemical-vapor deposition" (CVD) investigated AlN followed by GaN directly deposited on arrays of squares and rectangular stripes with a 3.5 μm height and different lateral dimensions (1-200 μm) on Si substrates.

SUMMARY OF THE INVENTION

It is an object of the invention to provide a monocrystalline group IIIA nitride layer with a reduced defect density, grown on a silicon substrate. This and other objects are achieved by a semiconductor wafer and a method for producing such a semiconductor wafer, the monocrystalline substrate wafer being structured to have tips on its top surface, each of the tips being covered in the given order with a group-IIIB silicide layer and a group-IIIB nitride layer, and the group-IIIB nitride layer covered with a monocrystalline group-IIIA nitride layer.

DETAILED DESCRIPTION OF THE PREFERRED EMBODIMENT

Figure 1:
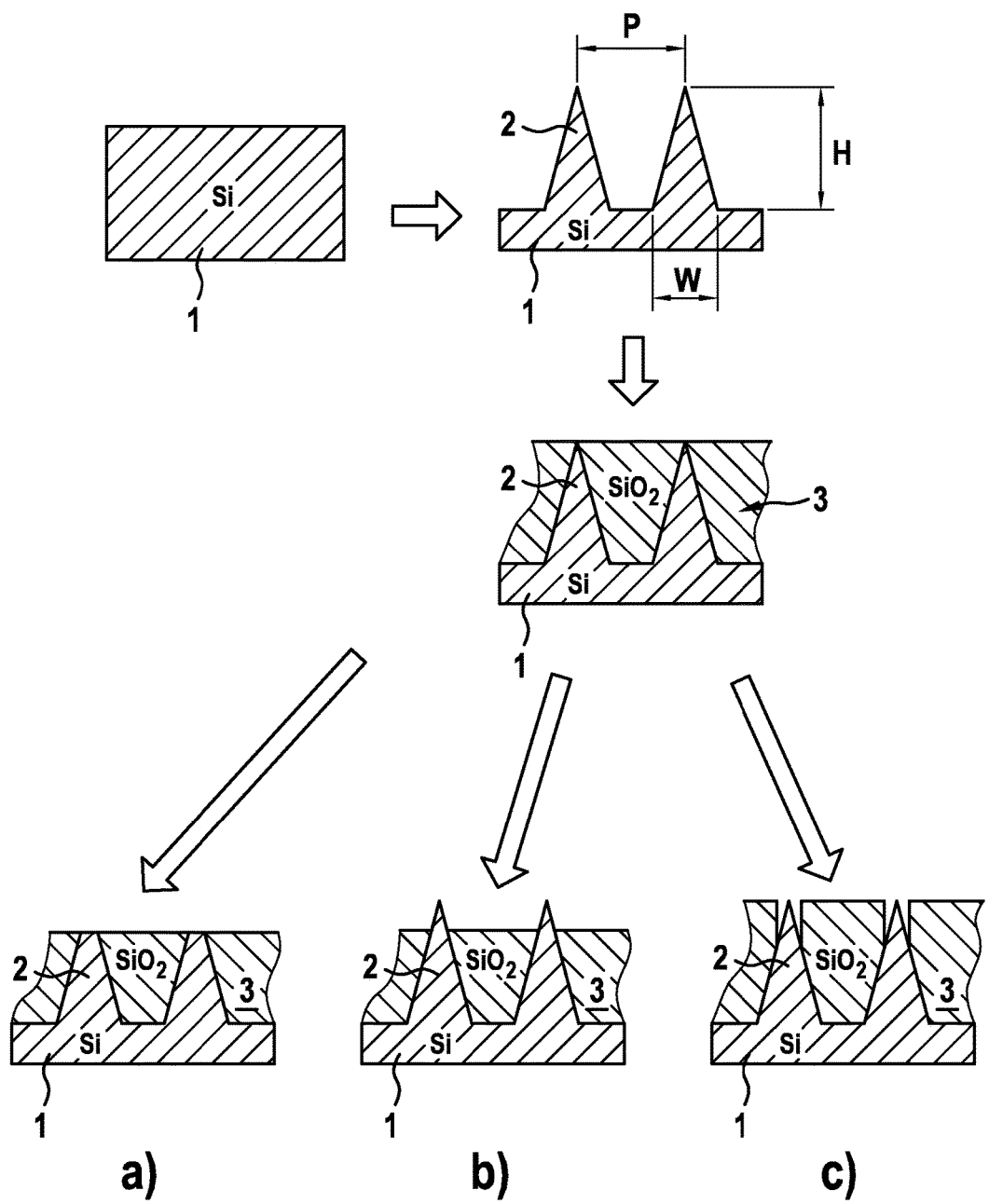
FIG. 1 schematically shows preferred steps for producing a silicon wafer having silicon nanotips.

The semiconductor wafer comprises a monocrystalline substrate wafer consisting essentially of silicon, preferably a Si(111) or Si(001) wafer. The monocrystalline substrate wafer is structured to have numerous monocrystalline silicon tips on its top surface, the monocrystalline silicon tips being separated from each other. Each monocrystalline silicon tip is covered in the given order with a group-IIIB silicide layer and a group-IIIB nitride layer generating group-IIIB nitride pads or a coalesced group-IIIB nitride film, where group-IIIB stands for IUPAC group 3, Scandium family elements, especially Scandium (Sc) and Yttrium (Y). The group-IIIB silicide layer is a closed layer and preferably consists of $Y_{1-z}Sc_zSi_x$ with $0 \le z \le 1$. Preferably, the group-IIIB silicide layer has a thickness which is not less than 5 nm. The group-IIIB nitride layer is preferably either a single layer of ScN or YN, or a double layer of YN and ScN (YN/ScN or ScN/YN), or a multiple mixed (of different stoichiometry) or graded layer of $Y_{1-x}Sc_xN$ with $0 \le x \le 1$. Finally, the monocrystalline group-IIIA nitride layer, especially $In_xAl_zGa_{1-(x+z)}N$ with $0 \le x, z, (x+z) \le 1$ is grown on the group-IIIB nitride pads or film. The group-IIIA nitride layer can be a coalesced film or a structured layer, e.g. an array of (nano-) rods, blocks, tips or pyramids.

In this invention, the prior art problems are addressed using nanoheteroepitaxy technique (single-crystal growth of one semiconductor on another) by structuring of the substrate wafer in such a way that "nanotips", i.e. thin needle-like Si structures of, for example, several 1 nm-10 μm bottom wide and 100 nm-50 μm high structures with a certain center-to-center distance (period) (100 nm-10 μm) to each other are created.

Then, the topmost part of the nanotips is transformed from Si to group-IIIB silicide, preferably $ScSi_x$ or $YSi_x$, keeping the epitaxial relationship of subsequent layers, followed by the deposition of epitaxial group-IIIB nitride, preferably ScN, especially ScN(111). Finally, group-IIIA nitride is deposited on top of group-IIIB nitride. It is advisable that in case of a coalesced group-IIIA nitride film on group-IIIB nitride pads, the contact area between the group-IIIB nitride pads and the coalesced group-IIIA nitride film is not more than 50% of the coalesced group-IIIA nitride film.

According to a preferred embodiment of the invention, the thickness of the group-IIIB silicide layer is not more than 50 nm.

According to a preferred embodiment of the invention, group-IIIB nitride is deposited on top of group-IIIB silicide by in situ nitridation of the group-IIIB silicide surface, preferably $ScSi_x$ or $YSi_x$ surface, especially a $ScSi_x(0001)$ or $YSi_x(0001)$ surface, or by MBE technique.

This invention addresses the issue of mechanical strain due to the possibility of the Si nanotips to absorb part of the strain in an elastic manner. Absorption of the strain due to the elastic deformation of the epilayer depends upon the volume of 3D void network inbetween Si and group-IIIA nitride layer. Optimized structure releases the stress and avoids cracking of group-IIIA nitride layer upon cooling down from the deposition temperature.

This invention addresses the lattice mismatch by the formation of intermediate layers. Preferably, the group-IIIB silicide topping of the Si nanotips is hexagonal $Y_{1-z}Sc_zSi_x$ (0001) with a lattice mismatch to Si(111) of −4.7%. According to a preferred embodiment group-IIIB nitride on top of the group-IIIB silicide topping is epitaxial ScN(111) with a lattice mismatch to GaN of only −0.1% resulting in the suppression of the formation of extended defects like e.g. misfit and threading dislocations which could be detrimental on the operation of a device made out of the deposited group-IIIA nitride layer. In the conventional method of group-IIIA nitride film deposition on Si, SiN formation at Si and nitride film interfaces may cause an epitaxial relationship problem. However, this invention avoids the formation of SiN.

C. Nörenberger et al., Surf. Sci. 600, 4126 (2006) "Surface structures of scandium silicides grown on Si(111) studied by STM, AFM and electron diffraction" investigated the formation of ScSi on Si(111) at different temperatures and revealed that if scandium silicide layers are grown at 900-920° C., they consist of the hexagonal $ScSi_2$ with the (110) and (101) faces parallel to the Si(111) surface. In the introduction of this publication it is stated, that a few monolayers of the hexagonal $ScSi_2$ have also been investigated as a possible interfacial layer when growing ScN on Si(111), which is a promising buffer layer for the growth of GaN on Si(111).

The inventive semiconductor wafer can advantageously be used as a substrate for producing light emitting elements (laser diode or LED etc.) and field effect transistors (FETs) for high power and high frequency applications. Light extraction efficiency of light emitting structure and the electrical breakdown voltage of the power transistor structure can be improved by fabricating respective structure on top of the inventive semiconductor wafer rather than on the classical GaN on Silicon approach.

The inventive semiconductor wafer can advantageously also be used for microstructure printing because well defined patches of GaN can be easily transferred by a separation step from the tips to another substrate.

Further advantages and embodiments of the invention will become apparent from the description and the appended figures.

It should be noted that the previously mentioned features and the features to be further described in the following are usable not only in the respectively indicated combination, but also in further combinations or taken alone, without departing from the scope of the present invention.

In the drawings preferred embodiments for producing a semiconductor wafer according to the invention comprising a monocrystalline substrate wafer consisting essentially of silicon and a monocrystalline GaN layer as group-IIIA nitride layer are shown.

Within the scope of the invention, a Si nanotips approach (for providing flexible seed area and thus opportunity for antiphase domain (APD) free group-IIIA nitride growth on Si by growth from one critical nucleus only) is combined with an innovative layer stack without using the classical AlN/AlGaN/GaN approach.

According to the preferred embodiment of the invention shown in the figures and explained in more detail below it is build up on Si nanotips a layer stack of:
1) $ScSi_x$ as a preferred embodiment of $Y_{1-z}Sc_zSi_x$ with $0 \le z \le 1$ in turn as a preferred embodiment of group-IIIB silicide: Epitaxial silicidation (an annealing (sintering) process resulting in the formation of metal-Si alloy (silicide)) of the Si nanotips to avoid GaN reaction with Si.
2) ScN as a preferred embodiment of $Y_{1-x}Sc_xN$ with $0 \le x \le 1$ in turn as a preferred embodiment of group-IIIB nitride: Epitaxial ScN growth to have zero lattice mismatch growth template 3) GaN as a preferred embodiment of $In_xAl_zGa_{1-(x+z)}N$ with $0 \leq x, z, (x+z) \leq 1$ in turn as a preferred embodiment of group-IIIA nitride: Functional GaN patches e.g. by ELO so that the resulting preferred heterostructure is given by Si/ScSi$_x$/ScN/GaN. It is noted that group-IIIB chemistry behaves similar to Al chemistry which provides a good guideline for stability of compounds discussed here.

Referring to FIG. 1, in a first step, a monocrystalline substrate wafer 1 is provided, which consists essentially of monocrystalline silicon, preferably of 90% to 100% silicon, more preferably of 98% to 100% silicon. The substrate wafer 1 may comprise the usual dopants or impurities generally known in the field of silicon technology. The substrate wafer 1 for instance has a crystal surface orientation of Si(111). The substrate wafer 1 may have a diameter of 100 mm to 450 mm. The surface of the substrate wafer is preferably polished.

Preferably, the substrate wafer 1 is annealed at high temperature to obtain a high quality silicon surface. The anneal temperature is between 600 and 1250° C. The annealing may be performed in a vacuum or under a reducing atmosphere, preferably comprising hydrogen, for 30 seconds to 30 minutes, preferably from one to ten minutes.

In a second step, nanotips 2 are formed on the upper surface of the silicon substrate layer 1. In the prior art, different techniques for forming nanotips are known, e.g. by defining the tips by photo lithography and removing Si by chemical and/or mechanical processes, e.g. etching, especially anisotropic wet etching. A height H, a width at the base W and a period P of the nanotips can be controlled by the lithography and etching process.

The height H advantageously is in the range of 100 nm-50 µm, the width W at the base of a nanotip advantageously is in the range of several 1 nm-10 µm, and the period P advantageously is in the range of 100 nm-10 µm. The maximum width ratio of the nanotips (width at the base: width at the top) is preferably 1000:1 and the maximum aspect ratio (height:width at the base) 1:1.

In a third step, a growth mask 3, in the example shown, amorphous SiO$_2$, is deposited on the silicon substrate wafer 1. Different material, e.g. SiN, can also be used.

Finally, Si areas on the upper ends of the nanotips are uncovered which form the basis for a subsequent silicidation step. This can be done
a) by a polishing step, e.g. by duration of chemical mechanical planarization (CMP) process,
b) by a (wet) etching step, e.g. with hydrofluoric acid (HF), or
c) by an anisotropic (wet) etching step, e.g. with potassium hydroxide (KOH).

Having uncovered tips as shown in b) and c) may lead to a deflection of dislocations in the GaN layer and thus provide a better quality. Examples a) and b) result in a planar surface, whereas example c) results in a rough surface with Si tips being recessed in SiO$_2$ indentations. b) and c) offer the advantage of dislocation reduction through deflection. a) and b) are advantageous as they offer planar growth. c) can be desirable for specific applications due to a potential rough surface or 3D growth.

Figure 2:
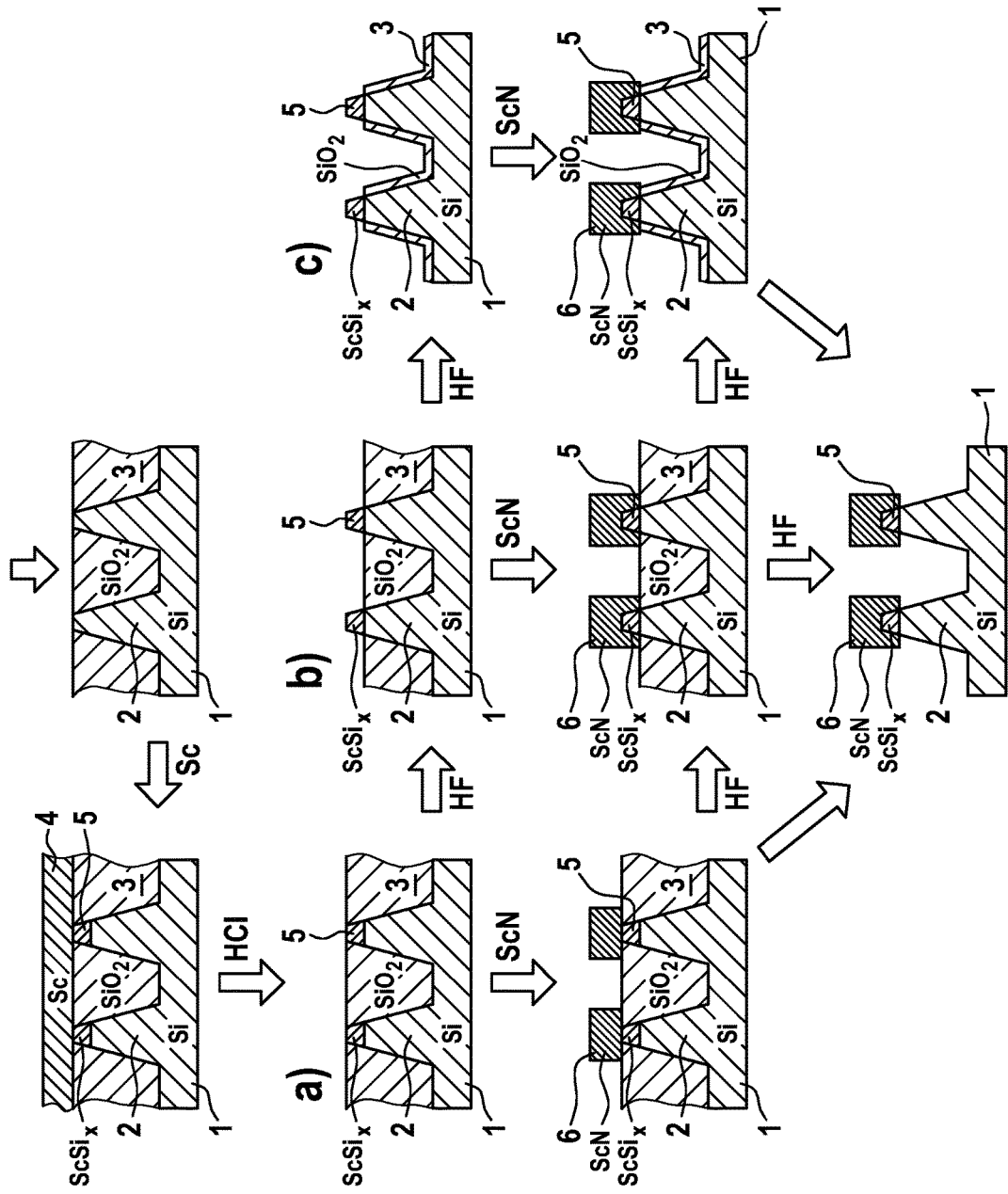
FIG. 2 schematically shows a preferred step for silicidation of silicon nanotips and different possibilities to deposit ScN as group-IIIB nitride on the silicidated nanotips to generate ScN pads.

In FIG. 2 further steps according to preferred embodiments of the invention are shown. The steps shown are performed on a silicon wafer having silicon nanotips according to example a) of FIG. 1, shown in the middle of the first line of FIG. 2.

In a first step, a thin scandium (and/or yttrium, in another embodiment not shown) layer 4 is deposited all over the cleaned patterned silicon tip area. Alternatively, a KOH etch might be applied before to achieve <111> facetted Si tips.

In a second step, higher temperatures are applied to form ScSi$_x$ 5 as a preferred embodiment of $Y_{1-z}Sc_zSi_x$ with $0 \leq z \leq 1$ as group-IIIB silicide at the top of the Si tips (shown on the left of the first line of FIG. 2). Preferably, the ScSi$_x$ pads 5 have a (0001) orientation. It is to be noted that Ti is neighboring Sc in the periodic system and TiSi$_x$ processes for low resistance contacts are well established in Si microelectronics.

Since group-IIIB silicides exhibit a small lattice mismatch and a variation in their crystal structures it became possible to grow epitaxial group-IIIB silicides on Si(001) and Si(111) by depositing a thin group-IIIB metal layer and annealing (cf. C. Nörenberger et al., ib.; Baptist et al., *Phys. Rev. Lett.* 64, 311 (1990); Rogero et al., *Phys. Rev. B* 66, 235421 (2002)). It is shown by AFM, STM and LEED studies that ScSi$_x$ can be formed with a hexagonal (0001) structure with 4.78% lattice mismatch on Si(111). Depending on the annealing temperature (450° C.-920° C.) different ScSi$_x$ surface reconstructions with a terrace width up to 200 nm were achieved. Thus, epitaxial single domain ScSi$_x$ films are formed on sufficiently small Si nanotips. It is to be noted that such a detailed surface science investigation is not known on Si(001), however XRD results indicate an orthorhombic ScSi structure at 500° C. and an hexagonal ScSi1.7 structure at 900° C., which is very similar with the behavior of Sc on Si(111).

In a further step (shown on the left of the second line), the residual Sc metal is removed from SiO$_2$ areas by hydrochloride acid (HCl) etching resulting in the ScSi$_x$ pads 5 being still embedded in the SiO$_2$ (example a)).

Optionally, a further HF etching step can be applied to completely uncover the ScSi$_x$ pads 5 (example b)) or to even remove the SiO$_2$ almost completely (example c)) for reducing strain.

In the following, ScN islands 6 are deposited on the epitaxial ScSi$_x$ passivated surface (shown in line 3) as a preferred embodiment of $Y_{1-x}Sc_xN$ with $0 \leq x \leq 1$ as group-IIIB nitride, e.g. by MBE or CVD process. Preferably, the ScN islands 6 have a (111) orientation.

In-situ nitridation of the (0001) ScSi$_x$ surface provides a few (up to 10) nm thick ScN(111) layer. A thin layer is preferred because of pronounced roughening tendency of the material. Nitridation is carried out using either NH$_3$ gas or one of many plasma sources, including an electron cyclotron resonance (ECR) or a radio-frequency (rf) nitrogen plasma source.

ScN(111) epitaxy can also be grown on ScSi$_x$ using MBE technique (cf. eg. M. Moram et al., *J. Cryst. Growth* 308, 302 (2007)). This technique is in particular an option if thicker ScN films are required.

The morphology (faceting etc.) and size (small islands of a few microns up to a coalesced film) can be controlled by ELO parameters.

These Si/ScSi$_x$/ScN pillar structures represent ideal nucleation sites for the low-strain and low-defect growth of group-IIIA nitride structures.

With nanopatterned Si substrates like Si nanotips on Si wafers, it becomes possible that the lattice mismatch strain between the epitaxial film and the substrate is not only stored in the substrate—as is inevitably the case for planar bulk Si substrates—but distributed between the growing epitaxial film and the nanopatterned Si tips. This so-called compliant effect is beneficial to favor the formation of coherent, only elastically relaxed interfaces between lattice mismatched semiconductors on Si. In other words, the so called critical thickness for the onset of plastic relaxation in the epitaxial film is substantially delayed; even to infinity in the most favorable conditions.

After formation of ScN, in a final optional step (shown in line 4), $SiO_2$ can be etched away using HF chemistry from the template to deposit GaN. However, a thin $SiO_2$ layer (<10 nm thick) can be intentionally left in between and on the side wall of the nanotips to protect further GaN deposition on these that helps to form a 3D void network as shown on the right of line 3.

Figure 3:
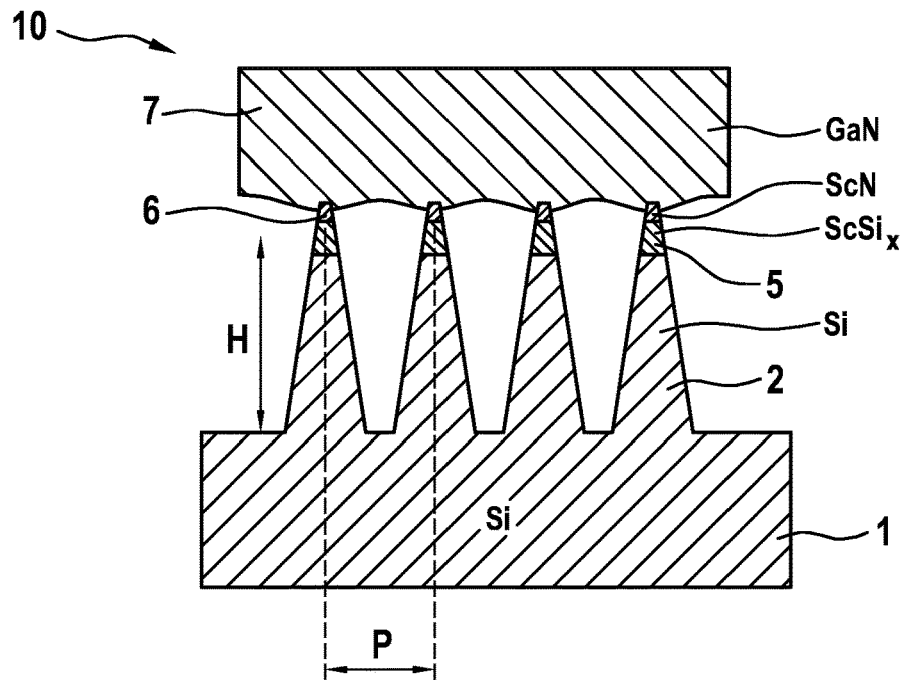
FIG. 3 schematically shows a preferred step for depositing a coalesced film as GaN layer on the ScN pads.
Figure 4:
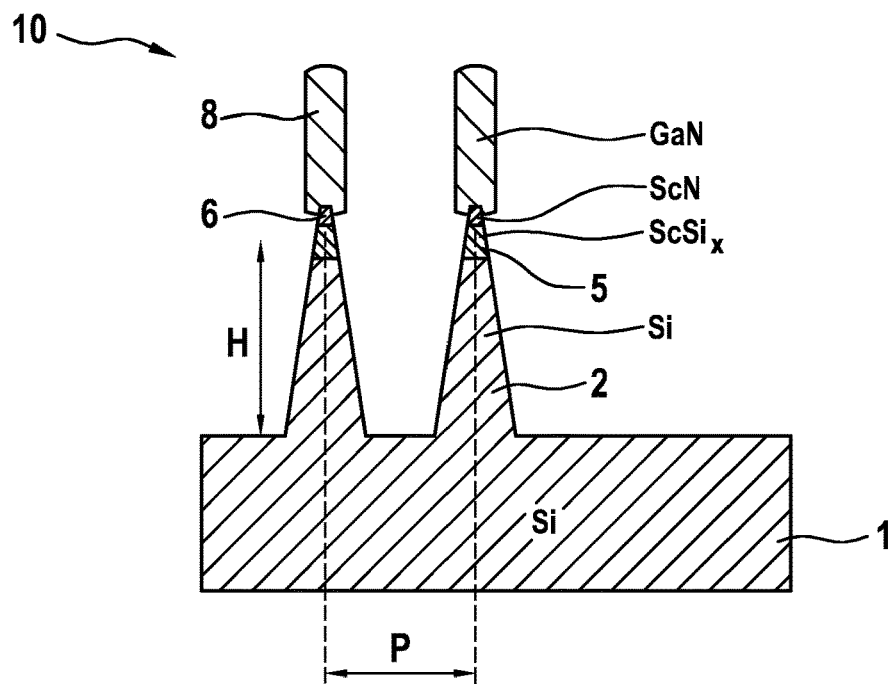
FIG. 4 schematically shows a preferred step for depositing nanorods as GaN layer on the ScN pads.

Referring now to FIGS. 3 and 4, in a next step GaN is deposited on the ScN islands 6 as a preferred embodiment of $In_xAl_zGa_{1-(x+z)}N$ with $0 \leq x, z, (x+z) \leq 1$ as group-IIIA nitride to produce a semiconductor wafer 10 according to a preferred embodiment of the invention. A coalesced GaN film 7 or GaN nanorods 8 (diameter preferably of several nanometers up to 10 µm; height preferably between several hundred nanometers and 10 µm) can be formed on the ScN islands 6 controlled by the depositing process parameters.

As mentioned above, growth of high quality GaN epilayers on Si is difficult. High density of threading dislocations due to ~-17% in-plane lattice mismatches and severe wafer bow and even layer cracking due to more than 55% coefficient of thermal expansion (CTE) mismatches between GaN and Si are the main challenges. In addition, Si heavily reacts with impinging Ga and $NH_3$ at high temperature that degrades the layer quality and wafer bow. AlN seed and AlGaN buffer layers are typically used to overcome these problems. Differently from the classical approach, according to the invention, the growth area of Si is covered with group-IIIB-$Si_x$ followed by group-IIIB-N. In conventional method of group-IIIA nitride film deposition on Si, SiN formation at Si and nitride film interface may cause an epitaxial relationship problem. However, the silicidation process avoids the formation of SiN. Proper design of pitch between nanotips and their height can limit the diffusion of reactive species inside the uncovered area in between nanotips. Basically, narrow pitch (P<3 µm) and a longer size (H>3 µm) of nanotips avoid nuclei formation at the bottom as well as on the sidewall of the structure (cf. eg. M. Ali et al., *J. Cryst. Growth* 315, 188 (2011)).

A faster growth of <0001> facet than <10-11> facet of GaN results in the formation of well-known pyramidal structure on patterned substrate (cf. e.g. A. Strittmatter et al., *Appl. Phys. Lett.* 78, 727 (2001); S. Tanaka et al., *Appl. Phys. Lett.* 79, 955 (2001)). However, due to growth rate anisotropy, lateral or vertical extension can be controlled by adjusting the group-V-IIIA ratio ($NH_3$ and MO precursor flows), growth temperature and pressure. Lateral growth can be promoted with increased group-V-IIIA ratio and high growth temperature. A coalesced GaN film 7 (FIG. 3) or nanorod structure 8 (FIG. 4) can be formed as a template for further device structure. GaN film or nanorod structures may consist of structures having a combination of group-IIIA elements (Al, Ga and In).

One concept of the invention to solve the wafer warpage problem in GaN on Si epiwafers and to reduce threading dislocation density in GaN epilayers is using nanoheteroepitaxy where the contact area between Si substrate and group-IIIA layer is less than 100%, preferably not more than 50% of the grown film. Thin structure of group-IIIB-$Si_x$ and group-IIIB-N are formed on the contact region between Si and group-IIIA nitride film to reduce the lattice mismatch whereas 3D void network is embedded in the non-contact region to absorb the strain evolving from thermal expansion coefficient mismatch between Si and nitride film.

Size and distribution of growth surfaces for group-IIIA nitride epi can be tuned in a wide range in order to match the requirements for efficient strain management and dislocation reduction. It is possible to grow a coalesced group-IIIA nitride film or nanorod structure by designing the nanotips template structure and growth optimization of group-IIIA nitride.

The invention claimed is:

1. A semiconductor wafer, comprising:
   a monocrystalline silicon substrate wafer having a top surface, the monocrystalline substrate wafer structured to have a multiplicity of tips on its top surface,
   each of the tips covered, in the order given, with a group-IIIB silicide layer having a thickness of not less than 5 nm, and a group-IIIB nitride layer, and
   the group-IIIB nitride layer covered with a monocrystalline group-IIIA nitride layer.

2. The semiconductor wafer of claim 1, wherein a contact area between the group-IIIB nitride layer and the monocrystalline group-IIIA nitride layer is not more than 50% of the group-IIIA nitride layer, in the case of a coalesced film.

3. The semiconductor wafer of claim 1, wherein the tips have a height between 100 nm and 50 µm.

4. The semiconductor wafer of claim 1, wherein the tips have a height between at least 3 µm and 50 µm.

5. The semiconductor wafer of claim 1, wherein the tips have a bottom width of between 1 nm and 10 µm.

6. The semiconductor wafer of claim 1, wherein the tips have a center-to-center distance between 100 nm and 10 µm.

7. The semiconductor wafer of claim 1, wherein the tips have a center-to-center distance between 100 nm and at most 3 µm.

8. The semiconductor wafer of claim 1, wherein the group-IIIB nitride layer has a (111) surface orientation.

9. The semiconductor wafer of claim 1, wherein the group-IIIB nitride layer comprises either a single layer of ScN or YN, or a double layer of ScN and YN, or a multiple mixed or graded layer of $Y_{1-x}Sc_xN$ with $0 \leq x \leq 1$.

10. The semiconductor wafer of claim 1, wherein the group-IIIB nitride layer has a (111) surface orientation and comprises either a single layer of ScN or YN, or a double layer of ScN and YN, or a multiple mixed or graded layer of $Y_{1-x}Sc_xN$ with $0 \leq x \leq 1$.

11. The semiconductor wafer of claim 1, wherein the silicide layer has a (0001) surface orientation.

12. The semiconductor wafer of claim 1, wherein the silicide layer is a $Y_{1-z}Sc_zSi_x$ with $0 \leq z \leq 1$.

13. The semiconductor wafer of claim 11, wherein the silicide layer is a $Y_{1-z}Sc_zSi_x$ with $0 \leq z \leq 1$.

14. The semiconductor wafer of claim 1, wherein the monocrystalline group-IIIA nitride layer is a coalesced film or a structured layer.

15. The semiconductor wafer of claim 1, wherein the monocrystalline group-IIIA nitride layer is structured layer comprising an array of rods, blocks, tips or pyramids.

16. The semiconductor wafer of claim 1, wherein the monocrystalline group-IIIA nitride layer is a monocrystalline $In_xAl_zGa_{1-(x+z)}N$ layer with $0 \leq x, z,$ and $(x+z) \leq 1$.

17. The semiconductor wafer of claim 1, wherein the monocrystalline group-IIIA nitride layer has a (0001) surface orientation.

18. The semiconductor wafer of claim 1, the monocrystalline substrate wafer is a Si(111) or Si(001) wafer.

19. In a process for producing light emitting elements, field effect transistors, or microstructure printing wherein a substrate is employed, the improvement comprising employing a semiconductor wafer of claim 1 or a portion thereof in the process as a substrate.

20. A method for producing a semiconductor wafer of claim 1, comprising the steps of:
- providing a monocrystalline substrate wafer,
- structuring the substrate wafer to form tips on its top surface,
- covering the tips, in the order given, with a group-IIIB silicide layer having a thickness of not less than 5 nm and with a group-IIIB nitride layer, and
- covering the group-IIIB nitride layer with a monocrystalline group-IIIA nitride layer.

21. The method of claim 20, wherein the step of covering the tips with a group-IIIB silicide layer and then with a group-IIIB nitride layer comprises forming the group-IIIB silicide layer by a silicidation process.

22. The method according to claim 21, wherein the step of covering the tips with a group-IIIB silicide layer and then with a group-IIIB nitride layer comprises depositing a group-IIIB nitride on top of a group-IIIB silicide by in situ nitridation of a group-IIIB silicide surface, or by molecular beam epitaxy.

\* \* \* \* \*

UNITED STATES PATENT AND TRADEMARK OFFICE
CERTIFICATE OF CORRECTION

PATENT NO. : 10,283,356 B2
APPLICATION NO. : 15/547529
DATED : May 7, 2019
INVENTOR(S) : Sarad Bahadur Thapa et al.

It is certified that error appears in the above-identified patent and that said Letters Patent is hereby corrected as shown below:

In the Claims

Column 8, Line 47, Claim 11:
Before "silicide layer"
Insert -- group -IIIB" --

Column 8, Line 49, Claim 12:
Before "silicide layer"
Insert -- group -IIIB" --

Column 8, Line 51, Claim 13:
Before "silicide layer"
Insert -- group -IIIB" --

Signed and Sealed this
Seventeenth Day of September, 2019

Andrei Iancu
*Director of the United States Patent and Trademark Office*